US012672468B2

(12) United States Patent
Dai et al.

(10) Patent No.: US 12,672,468 B2
(45) Date of Patent: Jun. 30, 2026

(54) DISPLAY PANEL AND DISPLAY DEVICE

(71) Applicant: BOE Technology Group Co., Ltd., Beijing (CN)

(72) Inventors: Qing Dai, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 420 days.

(21) Appl. No.: 18/271,048

(22) PCT Filed: Oct. 22, 2021

(86) PCT No.: PCT/CN2021/125614
§ 371 (c)(1),
(2) Date: Jul. 6, 2023

(87) PCT Pub. No.: WO2022/205851
PCT Pub. Date: Oct. 6, 2022

(65) Prior Publication Data
US 2024/0306473 A1      Sep. 12, 2024

(30) Foreign Application Priority Data

Mar. 31, 2021     (CN) ......................... 202110351981.4

(51) Int. Cl.
*H10K 59/80*          (2023.01)
*H10K 59/12*          (2023.01)

(52) U.S. Cl.
CPC ........... *H10K 59/873* (2023.02); *H10K 59/12* (2023.02)

(58) Field of Classification Search
CPC ............................. H10K 59/873; H10K 59/12
USPC .......................................................... 313/500
See application file for complete search history.

(56) References Cited

U.S. PATENT DOCUMENTS

| | | | |
|---|---|---|---|
| 2010/0225875 A1 | 9/2010 | Wang et al. | |
| 2018/0026225 A1 | 1/2018 | Kwon et al. | |
| 2018/0067353 A1* | 3/2018 | Son ......................... | H01L 24/05 |
| 2021/0184172 A1 | 6/2021 | Wang et al. | |
| 2022/0093895 A1 | 3/2022 | Zhang et al. | |

FOREIGN PATENT DOCUMENTS

| | | |
|---|---|---|
| CN | 107658386 A | 2/2018 |
| CN | 108598108 A | 9/2018 |
| CN | 109494242 A | 3/2019 |

(Continued)

OTHER PUBLICATIONS

World Intellectual Property Organization (WIPO) Search of PCT (Year: 2022).*

(Continued)

*Primary Examiner* — James R Greece
*Assistant Examiner* — Hana S Featherly
(74) *Attorney, Agent, or Firm* — XSENSUS LLP

(57) ABSTRACT

Provided is a display panel, including: a substrate including a display region and a packaging region surrounding the display region; and a cluster-shaped barrier structure surrounding the display region and disposed on a surface of the packaging region, wherein the cluster-shaped barrier structure includes a plurality of barrier strips, and a length extending direction of each barrier strip is intersected with an extending direction of an edge line of the display region.

19 Claims, 6 Drawing Sheets

(56) References Cited

FOREIGN PATENT DOCUMENTS

| | | | |
|---|---|---|---|
| CN | 112002831 | A | 11/2020 |
| JP | 2012003989 | A | 1/2012 |

OTHER PUBLICATIONS

International Search Report issued Jan. 17, 2022, in corresponding International Application No. PCT/CN2021/125614 , 13 pages.

* cited by examiner

（a）                                （b）

DISPLAY PANEL AND DISPLAY DEVICE

CROSS-REFERENCE TO RELATED APPLICATIONS

This application is a U.S. national stage of international application No. PCT/CN2021/125614, filed on Oct. 22, 2021, which claims priority to Chinese Patent Application No. 202110351981.4 filed on Mar. 31, 2021, the disclosures of which are incorporated herein by reference in their entireties.

TECHNICAL FIELD

The present disclosure relates to the field of display technologies, particularly to a display panel and a display device.

BACKGROUND

OLED (organic light-emitting diode) display devices have the advantages of fast response, high contrast, flexibility, and the like, and have wide application prospects. In general, the display panels are formed by cutting, which may lead to the exposure of the organic light-emitting material film. Therefore, the current display panel and the display device need to be improved.

SUMMARY

Some embodiments of the present disclosure provide a display panel. The display panel includes: a substrate including a display region and a packaging region surrounding the display region; and a cluster-shaped barrier structure surrounding the display region and disposed on a surface of the packaging region, wherein the cluster-shaped barrier structure includes a plurality of barrier strips, and a length extending direction of each barrier strip is intersected with an extending direction of an edge line of the display region.

According to some embodiments of the present disclosure, the plurality of barrier strips are sequentially disposed around the display region, ends, distal or proximal to the display region, of the barrier strips are connected to form continuous closed ends, while other ends of the barrier strips form open ends.

According to some embodiments of the present disclosure, the cluster-shaped barrier structure includes a plurality of first sub-cluster barrier structures and a plurality of second sub-cluster barrier structures disposed alternately, wherein each first sub-cluster barrier structure includes a plurality of first barrier strips, a length of the plurality of first barrier strips extends in a direction away from the display region, and the plurality of first barrier strips are disposed in sequential contact at one end to form a first closed end of the first sub-cluster barrier structure, and are spaced apart from each other at another end to form a first open end of the first sub-cluster barrier structure; each second sub-cluster barrier structure includes a plurality of second barrier strips, a length of the plurality of second barrier strips extends in the direction away from the display region, and the plurality of second barrier strips are disposed in sequential contact at one end to form a second closed end of the second sub-cluster barrier structure, and are spaced apart from each other at another end to form a second open end of the second sub-cluster barrier structure; in a circumferential direction of the display region, the first closed end and the second open end are disposed adjacently, and the first open end and the second closed end are disposed adjacently.

According to some embodiments of the present disclosure, the barrier strips have a cross-section of at least one of an I-shaped structure or a T-shaped structure in a width direction.

According to some embodiments of the present disclosure, the first closed end and the second open end disposed adjacently are disposed substantially flush, and the first open end and the second closed end disposed adjacently are disposed substantially flush.

According to some embodiments of the present disclosure, the display panel further includes a first protrusion disposed on a side, distal to the first open end, of the first closed end, wherein the first protrusion is integrated with the first sub-cluster barrier structure; and a second protrusion disposed on a side, distal to the second open end, of the second closed end, wherein the second protrusion is integrated with the second sub-cluster barrier structure.

According to some embodiments of the present disclosure, each barrier strip has a tangent line at contact with the edge line of the display region, and an included angle between the tangent line and the barrier strip define ranges from 70 to 90 degrees.

According to some embodiments of the present disclosure, a top width of the barrier strip is d microns and an included angle between two adjacent barrier stripes is $\varphi$ degrees, wherein $\varphi<0.12d+0.3$.

According to some embodiments of the present disclosure, the top width of the barrier strip ranges from 5 to 20 microns.

According to some embodiments of the present disclosure, q is 0.1 to 2.

According to some embodiments of the present disclosure, each of the first sub-cluster barrier structures includes 5 to 50 first barrier strips and each of the second sub-cluster barrier structures includes 5 to 50 second barrier strips.

According to some embodiments of the present disclosure, a length of the barrier strip ranges from 1 to 8 mm.

According to some embodiments of the present disclosure, a top thickness of the barrier strip arranges from 0.1 to 0.3 microns.

According to some embodiments of the present disclosure, a thickness of the barrier strip has ranges from 0.4 to 1.3 microns.

According to some embodiments of the present disclosure, the barrier strip is made of at least one of titanium, aluminum, or titanium-aluminum alloy.

According to some embodiments of the present disclosure, the display panel further includes an inorganic layer disposed between the substrate and the cluster-shaped barrier structure.

According to some embodiments of the present disclosure, the display panel further includes a plurality of strip-shaped barrier structures spaced apart from each other, wherein the strip-shaped barrier structures are disposed around a side, distal or proximal to the display region, of the cluster-shaped barrier structure, and the strip-shaped barrier structure has a cross-section of an I-shaped structure or a T-shaped structure in a width direction.

According to some embodiments of the present disclosure, a length extending direction of each strip-shaped barrier structure is substantially consistent with the extending direction of the edge line of the display region.

Some embodiments of the present disclosure provide a display device. The display device includes the display panel described above.

DETAILED DESCRIPTION

Figure 1:
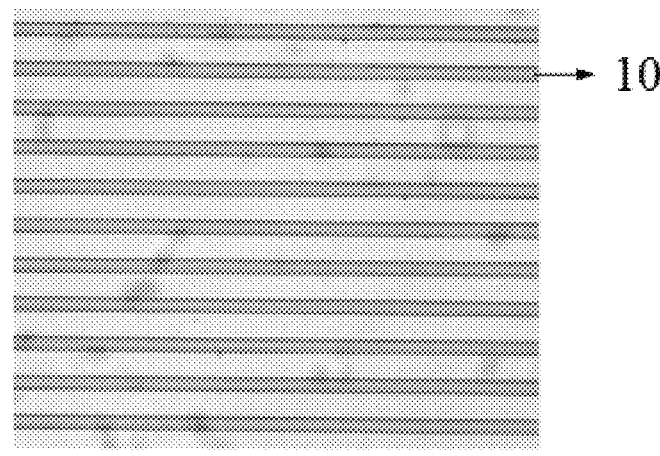
FIG. 1 shows a schematic view of the edge packaging structure for the display panel in the prior art.

Embodiments of the present disclosure will be described below in detail, examples of which are illustrated in the accompanying drawings, wherein the same or similar reference numerals indicate the same or similar elements or elements having the same or similar functions throughout. The embodiments described below with reference to the accompanying drawings are illustrative for explaining present disclosure, and should not be construed as limiting the present disclosure.

The film formation processes for organic light-emitting materials corresponding to existing production lines and devices are rectangular film formation processes, in which the display panels with a desired shape are acquired by cutting the devices. The light-emitting organic film is usually exposed at the cutting edge of the display screen, and in this case, moisture and oxygen can infiltrate from the exposed organic film and into the light-emitting region, thereby corroding the organic material in the light-emitting region, and affecting the use of the display panel. To prevent this situation, a common method in the prior art is to manufacture a block at the cutting edge, as shown in FIG. 1. A plurality of barrier structures 10 parallel to the cutting edge are manufactured along the cutting edge to block the organic layer laterally, such that the ink of the light-emitting material falling at the edge packaging region falls into the gap between the barrier structures of the edge packaging region; the ink cannot form a continuous film layer in the packaging region, thereby cutting off the extending path of water and oxygen. However, as the barrier structure has certain lyophobic characteristics due to the coarse structure (at the micro-nano level), the ink of the light-emitting material falling at the edge packaging region is randomly gathered and migrates to form large ink spots. A through-connecting path of the organic material is formed after the ink evaporates, and the edge of the display panel cannot be effectively packaged. A cluster-shaped barrier structure can be formed at the edge packaging region of the display panel. The cluster-shaped barrier structure includes a plurality of barrier strips, with length extending directions of the barrier strips intersecting with the extending direction of the edge line of the display region. In this case, the ink of the light-emitting materials falling into the edge packaging region migrates along the direction in which the barrier strips are gathered, such that the middle part of the packaging structure is kept clean, the organic film layer in the packaging region is effectively separated, and external moisture and oxygen cannot infiltrate into the display region through the organic materials exposed out of the packaging edge, thereby improving the reliability of the edge packaging of the display panel.

Figure 2:
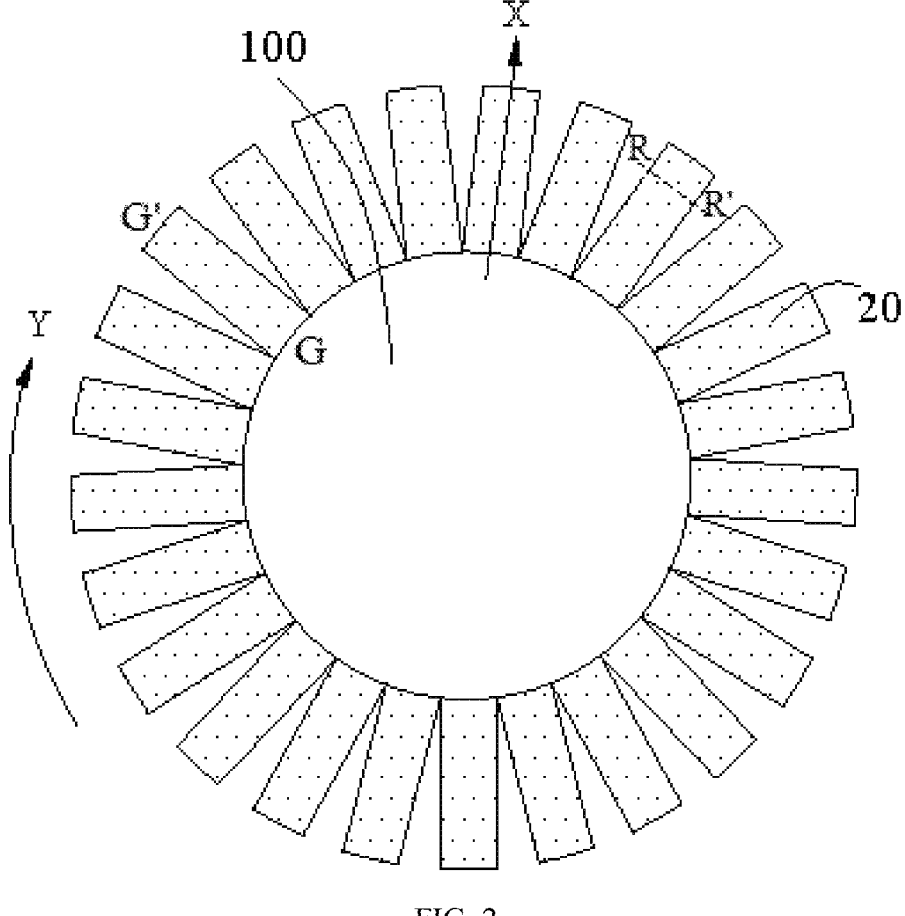
FIG. 2 shows a schematic structural diagram of a display panel according to some embodiments of the present disclosure.
Figure 5:
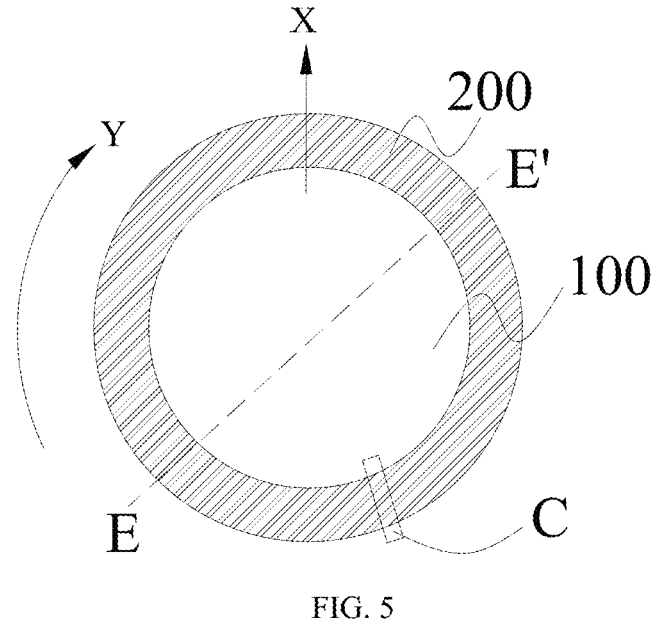
FIG. 5 shows a schematic structural diagram of another display panel according to some embodiments of the present disclosure.
Figure 6:
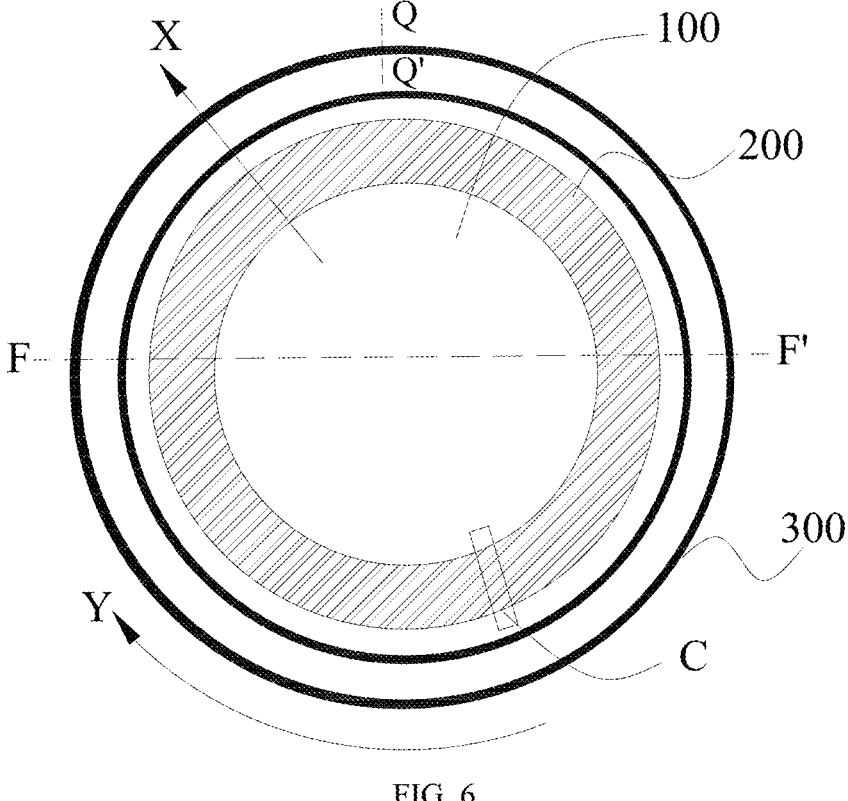
FIG. 6 shows a schematic structural diagram of still another display panel according to some embodiments of the present disclosure.
Figure 7:
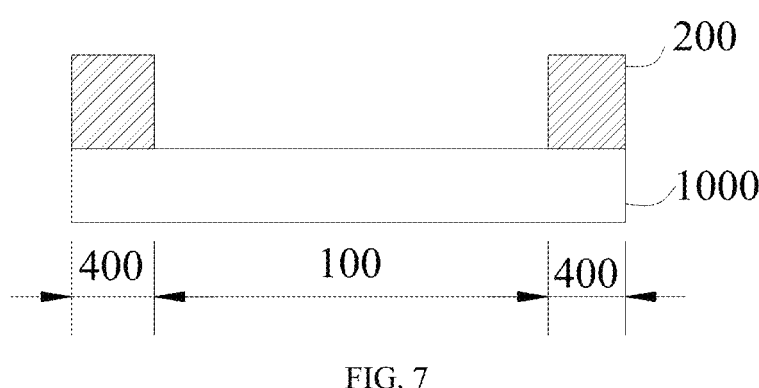
FIG. 7 shows a cross-sectional view of a display panel according to some embodiments of the present disclosure.
Figure 8:
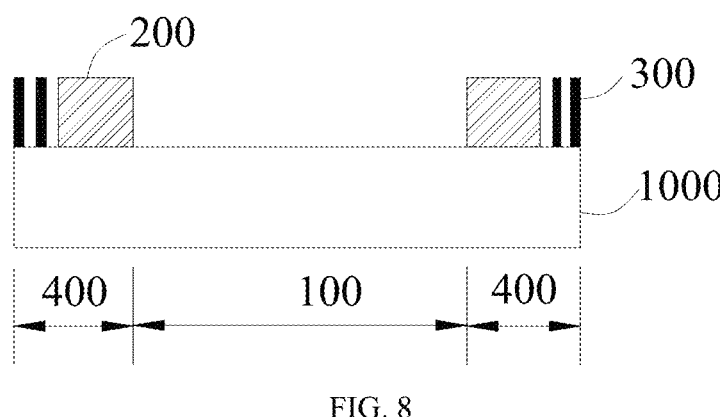
FIG. 8 shows a cross-sectional view of another display panel according to some embodiments of the present disclosure.

In one aspect of the present disclosure, the present disclosure provides a display panel. As shown in FIG. 2, the display panel includes: a substrate 1000 (as shown in FIG. 7 or 8) including a display region 100 (as shown in FIGS. 5 to 8) and a packaging region 400 (as shown in FIG. 7 or 8, wherein the component arrangement of the display region is not shown in FIGS. 7 and 8, FIG. 7 is a cross-sectional view of FIG. 5 along EE', and FIG. 8 is a cross-sectional view of FIG. 6 along FF') surrounding the display region 100; and a cluster-shaped barrier structure 200 (as shown in FIGS. 5 to 8) surrounding the display region 100 and disposed on a surface of the packaging region 400, the cluster-shaped barrier structure 200 includes a plurality of barrier strips 20, and the length extending directions (direction X) of the barrier strips 20 is intersected with the extending direction (direction Y) of the edge line of the display region. In this way, when the light-emitting layer is forming, the ink of the light-emitting materials falling into the packaging region migrates to the edge, distal or proximal to the display region, of the packaging structure along the direction in which the barrier strips are gathered, such that the middle part of the packaging structure is kept clean, the organic film layer in the packaging region is effectively separated, and external moisture and oxygen cannot infiltrate into the display region through the organic materials exposed at the packaging edge, thereby improving the reliability of the edge packaging.

According to some embodiments of the present disclosure, as shown in FIG. 2, the plurality of barrier strips 20 are sequentially disposed around the display region 100, and ends, distal or proximal to the display region, of the barrier strips 20 are connected to form continuous closed ends G, while other ends of the barrier strips form open ends G' (the closed ends refer to the ends that are disposed in connection and contact with each other of the plurality of barrier strips, and the open ends refer to other ends that are spaced apart from each other and not connected to each other of the plurality of barrier strips). It should be noted that FIG. 2 only exemplarily illustrates the case where the plurality of barrier strips 20 form the continuous closed end at the ends proximal to the display region 100 and form the open end at the ends distal to the display region 100. In some other embodiments, the plurality of barrier strips 20 may also form a continuous closed end at the ends distal to the display region 100 and form an open end at the ends proximal to the display region 100. In this way, when a light-emitting layer is forming, the ink of the light-emitting materials falling into the edge packaging region migrates to the closed end along the direction in which the barrier strips are gathered, such that the middle part of the packaging structure is kept clean, the organic film layer in the packaging region is effectively separated, which effectively prevents moisture and oxygen infiltrating into the display region, thereby improving the reliability of the edge packaging.

Figure 10:
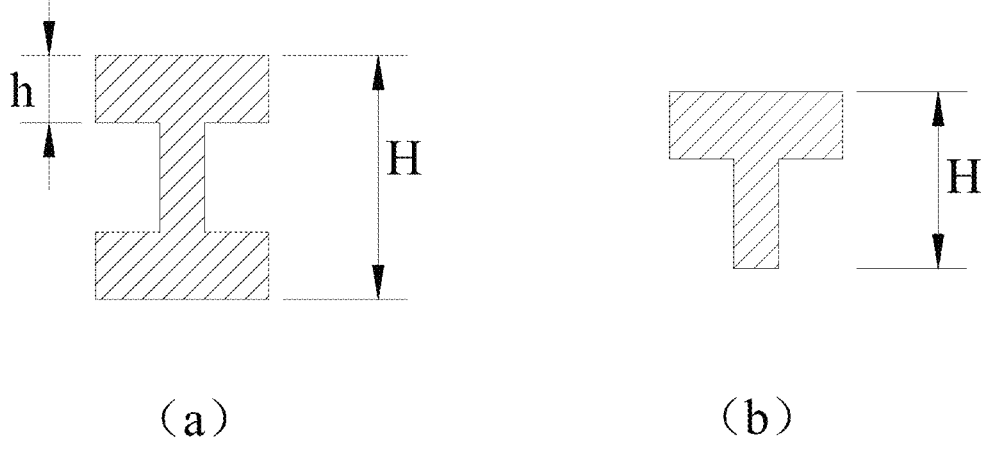
FIG. 10 shows a cross-sectional view of a barrier strip according to some embodiments of the present disclosure.
Figure 11:
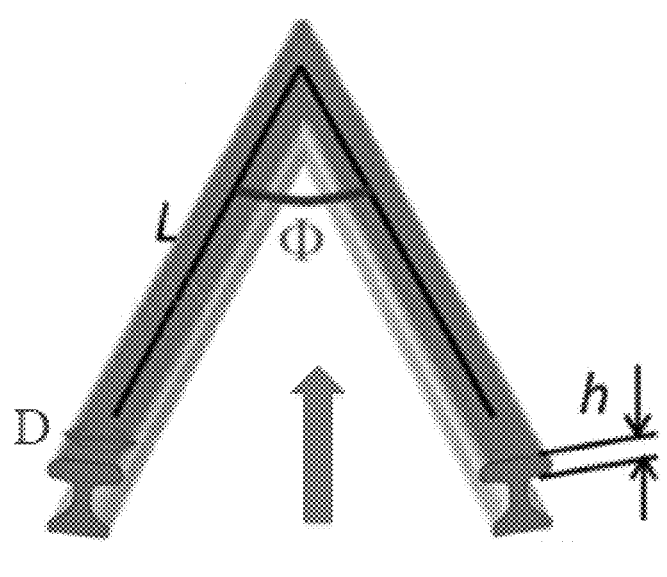
FIG. 11 shows a schematic structural diagram of two adjacent barrier strips according to some embodiments of the present disclosure.

According to some embodiments of the present disclosure, as shown in FIG. 2, the cross-section of the barrier strip in the width direction (i.e., the cross-section of the barrier strip 20 along RR') has an I-shaped structure (as shown in (a) of FIG. 10 and FIG. 11) or a T-shaped structure (as shown in (b) of FIG. 10). That is, the barrier strips are in at least one of I-shaped or T-shaped structure. As a gap is present between two adjacent barrier strips, the ink of the light-emitting material falling in the packaging region cannot directly fall in the bottom of the I-shaped or the T-shaped structure along the I-shaped or the T-shaped structure but can migrate and thus be gathered towards the closed end in the length direction (direction X) of the barrier strips, such that the middle part of the packaging region is kept clean, and the continuous organic film layer cannot be formed in the packaging region, thereby improving the reliability of edge packaging of the display panel.

Figure 3:
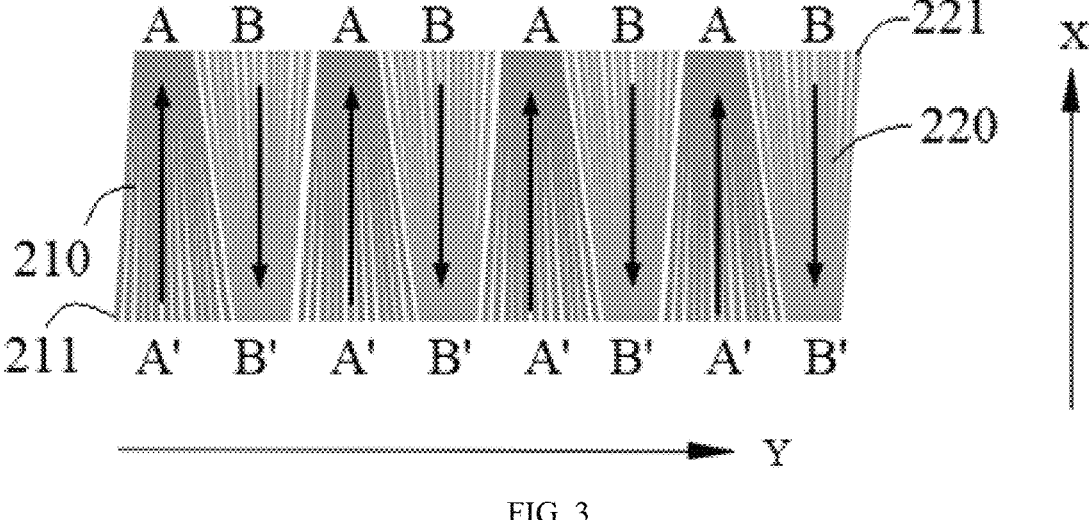
FIG. 3 shows a schematic diagram of a cluster-shaped barrier structure of a display panel according to some embodiments of the present disclosure.
Figure 4:
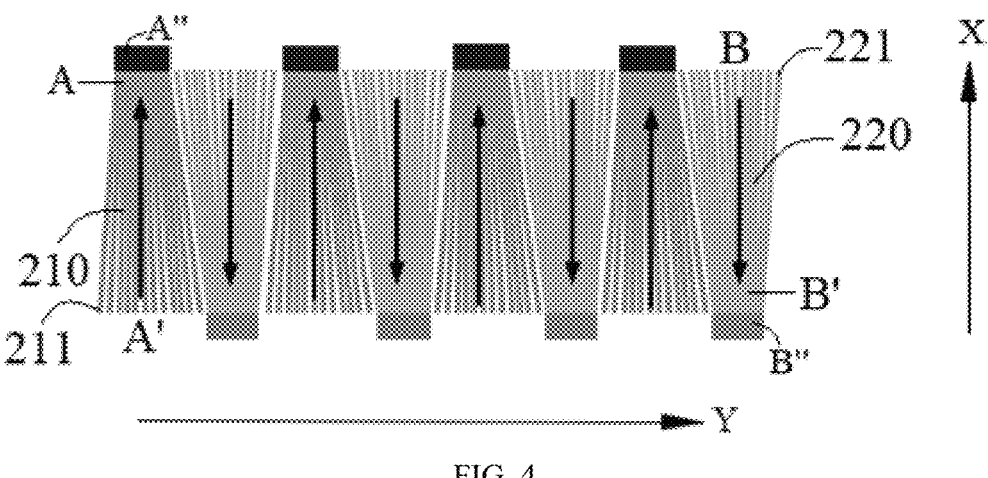
FIG. 4 shows a schematic diagram of another cluster-shaped barrier structure of a display panel according to some embodiments of the present disclosure.

According to some embodiments of the present disclosure, as shown in FIG. 3 or 4, the cluster-shaped barrier structure 200 includes a plurality of first sub-cluster barrier structures 210 and a plurality of second sub-cluster barrier structures 220 disposed alternately, wherein the first sub-cluster barrier structure 210 includes a plurality of first barrier strips 211, a length of the plurality of first barrier strips 211 extends in a direction (direction X) away from the display region, and the plurality of first barrier strips 211 are disposed in sequential contact at one end to form a first closed end A of the first sub-cluster barrier structure 210, and are spaced apart from each other at the other end to form a first open end A' of the first sub-cluster barrier structure; the second sub-cluster barrier structure 220 includes a plurality of second barrier strips 221, a length of the plurality of second barrier strips 221 extends in the direction (direction X) away from the display region, and the plurality of second barrier strips 221 are disposed in sequential contact at one end to form a second closed end B' of the second sub-cluster barrier structure, and are spaced apart from each other at the other end to form a second open end B of the second sub-cluster barrier structure; in a circumferential direction (direction Y) of the display region, the first closed end A and the second open end B are disposed adjacently, and the first open end A' and the second closed end B' are disposed adjacently. As such, in the process of printing the ink of the light-emitting material, the cluster-shaped barrier structure makes the light-emitting material falling in the edge packaging region rapidly migrate to the closed end of the barrier structure, such that the ink cannot form a continuous film layer in the edge packaging region, and moisture and oxygen cannot infiltrate into the display region through the organic light-emitting material in the edge packaging region, thereby improving the edge packaging effect of the display panel. Moreover, due to the disposition of the cluster-shaped barrier structure, the ink can flow to the regions of two sides where no cluster-shaped barrier structure is disposed when the ink of the light-emitting material falling in the packaging region is gathered to the first closed end or the second closed end, such that the storage capacity of the ink can be increased. Even if the ink is excessive, no continuous film layer will be formed in the edge packaging region, and the edge of the display panel can be packaged more effectively.

It should be noted that the curve formed by A'B' or AB in FIG. 3 substantially is in coincidence with the edge of the display region. That is, the cluster-shaped barrier structure is disposed along the edge of the display region. Referring to FIG. 5 or 6, the cluster-shaped barrier structure 200 is disposed around the edge of the display region 100, wherein an enlarged view of a portion C of the cluster-shaped barrier structure in FIG. 5 or 6 may refer to FIG. 3 or 4. In addition, the specific shape of the display panel in the present disclosure is not particularly limited, the display screen may have a circular, oval, square, or other irregular shape, and can be disposed by those skilled in the art according to actual design needs. According to some specific embodiments of the present disclosure, referring to FIG. 5, the display region 100 is circular, and the cluster-shaped barrier structure 200 disposed around the edge thereof is disposed as a ring-shaped structure as shown in the figure. In this case, direction X is the length extending direction of the first barrier strip 211 or the second barrier strip 221.

According to some embodiments of the present disclosure, referring to FIGS. 2 and 3, the first closed end A and the second open end B disposed adjacently are disposed substantially flush, and the first open end A' and the second closed end B' disposed adjacently are disposed substantially flush. As such, it is favorable for improving the edge packaging effect of the display panel, and for disposing the first sub-cluster barrier structure 210 and the second sub-cluster barrier structure 220 in a reasonable and effective arrangement. The ink is effectively prevented from forming a continuous film layer in the edge packaging region, such that moisture and oxygen cannot infiltrate into the display region through the organic light-emitting material in the edge packaging region, thus improving the edge packaging effect of the display panel. It should be noted herein that, in the case that the cluster-shaped barrier structure is being manufactured, it is difficult to ensure that the adjacent first closed end and the second open end are disposed absolutely flush and that the adjacent first open end and the second closed end are disposed absolutely flush due to manufacturing process, apparatus precision, and other reasons. Therefore, the description herein is that the first closed end and the second open end disposed adjacently are disposed substantially flush, and the first open end and the second closed end disposed adjacently are disposed substantially flush.

According to some embodiments of the present disclosure, referring to FIG. 4, the display panel further includes a first protrusion A" disposed on a side, distal to the first open end A', of the first closed end A, the first protrusion A" being integrated with the first sub-cluster barrier structure 210; and a second protrusion B" disposed on a side, distal to the second open end B, of the second closed end B' the second protrusion B" being integrated with the second sub-cluster barrier structure 220. As such, it is favorable for improving the edge packaging effect of the display panel.

Figure 9:
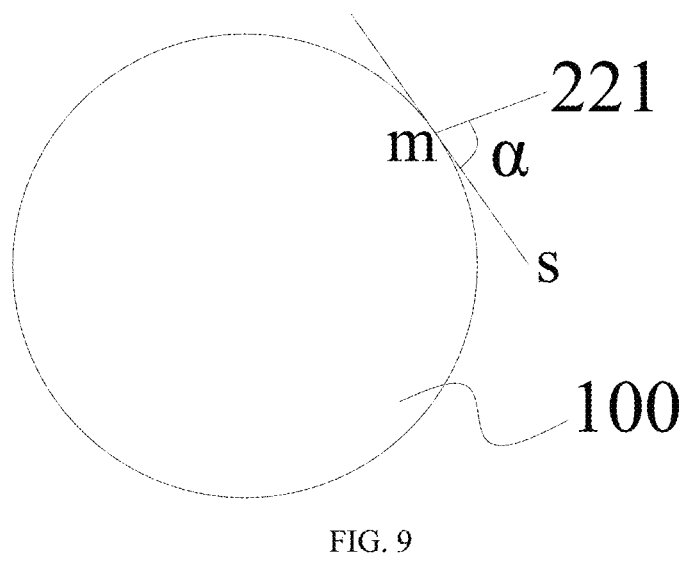
FIG. 9 shows a schematic view of the relationship between a barrier strip and a tangent line at the edge of a display region according to some embodiments of the present disclosure.

According to some embodiments of the present disclosure, the barrier strip has a tangent line at contact with the edge line of the display region, and an included angle between the tangent line and the barrier strip ranges from 70 to 90 degrees. As such, a proper included angle (close to 90 degrees) is present between the barrier strip and the tangent line, which is not only favorable for the arrangement of the barrier strip, but also advantageous for the directional movement of the ink droplet to the closed end, and is therefore desirable for improving the reliability of the edge packaging of the display panel. According to some specific embodiments of the present disclosure, the first barrier strip 211 has a first tangent line at contact with the edge line of the display region 100, and an included angle between the first tangent line and the first barrier strip 211 ranges from 70 to 90 degrees, for example, 70 degrees, 75 degrees, 80 degrees, 85 degrees, 90 degrees, and the like; the second barrier strip 221 has a second tangent line at contact with the edge line of the display region, and an included angle between the second tangent line and the second barrier strip 221 ranges from 70 to 90 degrees, for example, 70 degrees, 75 degrees, 80 degrees, 85 degrees, 90 degrees, and the like. The following detailed description is introduced by taking the second barrier strip as an example. Referring to FIG. 9, a point m is on the edge line of the display region 100, and the second barrier strip 221 (the barrier strip is represented only as a line segment herein for description) contacts with the edge line of the display region at the point m, where the second tangent line of the edge line of the display region is represented as s, and the included angle $\alpha$ between the second tangent line s and the second barrier strip ranges from 70 to 90 degrees. It should be noted that the included angle $\alpha$ between the second tangent line and the second barrier strip is an acute angle or a right angle. Similarly, the included angle between the first tangent line and the first barrier strip ranges from 70 to 90 degrees. As such, proper included angles being present between the first barrier strip and the first tangent line and between the second barrier strip and the second tangent line, that is, one of the first barrier strips in the first sub-cluster barrier structure is approximately perpendicular to or perpendicular to the first tangent line, and one of the second barrier strips in the second sub-cluster barrier structure is approximately perpendicular to or perpendicular to the second tangent line, such arrangement is not only favorable for the arrangement of the first barrier strip or the second barrier strip, but also advantageous for the directional movement of the ink droplet thereon, thereby improving the reliability of the edge packaging of the display panel.

According to some embodiments of the present disclosure, referring to FIGS. 10 and 11, all the barrier strips have a cross-section of an I-shaped structure (as shown in panel (a) in FIG. 10 and FIG. 11) or a T-shaped structure (as shown in panel (b) in FIG. 10) in the width direction. In some specific embodiments, both the first barrier strips 211 and the second barrier strips 221 have a cross-section of an I-shaped structure (as shown in panel (a) of FIG. 10 and FIG. 11) or a T-shaped structure (as shown in panel (b) of FIG. 10) in the width direction. As such, the first barrier strips or the second barrier strips are in at least one of I-shaped or T-shaped structure. A gap is present between two adjacent first barrier strips or two adjacent second barrier strips, and the ink of the light-emitting material falling in the packaging region cannot directly fall in the bottom of the I-shaped or the T-shaped structure along the I-shaped or the T-shaped structure but can migrate and thus be gathered towards the closed end in the length direction of the first barrier strips or the second barrier strips, such that the middle part of the packaging region is kept clean, and a continuous organic film layer cannot be formed in the packaging region, which is favorable for improving the reliability of edge packaging of the display panel.

According to some embodiments of the present disclosure, referring to FIG. 11, a top width D of the barrier strip is d microns and an included angle between two adjacent barrier stripes is $\Phi$ of $\varphi$ degrees, wherein $\varphi < 0.12d+0.3$. In the case that the relation $\varphi < 0.12d+0.3$ is met, the cluster-shaped barrier structure enables the ink droplet of the light-emitting material falling in the packaging region to migrate directionally. The ink droplets are gathered to the closed end. That is, the ink droplets are all gathered at the edge of the cluster-shaped barrier structure, and no continuous film layer will be formed in the edge packaging region, which improves the packaging effect of the cluster-shaped barrier structure, thereby improving the performance of the display panel. According to some specific embodiments of the present disclosure, the included angle between two adjacent first barrier strips and the included angle between two adjacent second barrier strips are both $\varphi$ degrees, and meet the relation $\varphi < 0.12d+0.3$. As such, the first sub-cluster barrier structure and the second sub-cluster barrier structure enable the ink droplets of the light-emitting materials falling in the packaging region to migrate directionally to the first closed end or the second closed end, such that the middle part of the packaging region is kept clean, thereby effectively prevented infiltration of moisture and oxygen into the display.

According to some embodiments of the present disclosure, referring to FIG. 11, the top width D of the barrier strip is 5 to 20 microns, i.e., D is 5 to 20 $\mu$m. As such, it is favorable for the lyophobic characteristic of the barrier strip, which advantageously improves the reliability of the edge packaging of the display panel. According to some specific embodiments of the present disclosure, the top width of the first barrier strip is 5 microns, 6 microns, 8 microns, 10 microns, 12 microns, 15 microns, 18 microns, and 20 microns, and the top width of the second barrier strip is 5 microns, 6 microns, 8 microns, 10 microns, 12 microns, 15 microns, 18 microns, and 20 microns. As such, it is favorable for the lyophobic characteristic of the first barrier strip or the second barrier strip, which further improves the effect of the edge packaging of the display panel. It should be noted that the top width of the same barrier strip is disposed to be equal, or may be disposed to be unequal, and can be determined by those skilled in the art according to actual conditions, as long as the width is between 5 and 20 microns.

According to some embodiments of the present disclosure, q is 0.1 to 2. According to some specific embodiments of the present disclosure, q is 0.1, 0.2, 0.3, 0.5, 0.8, 1, 1.2, 1.3, 1.5, 1.8, and 2. That is, the included angle between two adjacent barrier strips is 0.1 degrees, 0.2 degrees, 0.3 degrees, 0.5 degrees, 0.8 degrees, 1 degree, 1.2 degrees, 1.3 degrees, 1.5 degrees, 1.8 degrees, and 2 degrees. As such, it is favorable for further improving the edge packaging effect of the display panel. In the case that $\varphi$ is greater than 2, the gap between two adjacent barrier strips is too large to support the ink droplets thereon, and the ink droplets may fall into the gap and cannot migrate directionally to the closed end, which is undesirable for the effective edge packaging of the display panel.

According to some specific embodiments of the present disclosure, the degree of the included angle between two adjacent first barrier strips or the included angle between two adjacent second barrier strips is 0.1 to 2 degrees, for example, 0.1 degrees, 0.2 degrees, 0.3 degrees, 0.5 degrees, 0.8 degrees, 1 degree, 1.2 degrees, 1.3 degrees, 1.5 degrees, 1.8 degrees, and 2 degrees. In the case that $\varphi$ is greater than 2, a large distance between two adjacent first barrier strips 211 at the end of the first open end A' of the first sub-cluster barrier structure 210 or a large distance between two adjacent second barrier strips 221 at the end of the second open end B of the second sub-cluster barrier structure 220 may cause that the two adjacent first barrier strips 211 or the two adjacent second barrier strips 221 cannot support the ink droplets thereon, and the ink droplets may fall into the gap between two adjacent first barrier strips or two adjacent second barrier strips, and cannot continue to migrate directionally to the first closed end A or the second closed end B', which is undesirable for improving the packaging effect.

According to some embodiments of the present disclosure, each of the first sub-cluster barrier structures 210 includes 5 to 50 first barrier strips 211 and each of the second sub-cluster barrier structures 220 includes 5 to 50 second barrier strips 221. According to some specific embodiments of the present disclosure, each of the first sub-cluster barrier structures 210 includes 5, 8, 10, 15, 20, 25, 30, 35, 40, 45, or 50 first barrier strips 211, and each of the second sub-cluster barrier structures 220 includes 5, 8, 10, 15, 20, 25, 30, 35, 40, 45, and 50 second barrier strips 221. As such, the barrier strips forming each of the sub-cluster barrier structures are controlled within the scope described above, which is favorable for further improving the edge packaging effect of the display panel. In the case that the number of the first barrier strips or second barrier strips forming the sub-cluster barrier structure is more than 50, the first barrier strips or the second barrier strips may not be easily arranged well, which may increase the difficulties in manufacturing the sub-cluster barrier structure and the cost; in the case that the number of the first barrier strips or the second barrier strips forming the sub-cluster barrier structure is less than 5, it is difficult to achieve the effect of directional migration of the ink droplets, and the edge of the display panel cannot be effectively packaged.

According to some embodiments of the present disclosure, referring to FIG. 11, the length L of the barrier strip is 1 to 8 mm, for example, 1 mm, 2 mm, 3 mm, 4 mm, 5 mm, 6 mm, 7 mm, and 8 mm. As such, it is favorable for the cluster-shaped barrier structure to effectively package the edge of the display panel. According to some specific embodiments of the present disclosure, the length L of the first barrier strip is 1 to 8 mm, and the length L of the second barrier strip is 1 to 8 mm. Referring to FIG. 11, the length L of the first barrier strip or the second barrier strip is 1 mm, 2 mm, 3 mm, 4 mm, 5 mm, 6 mm, 7 mm, and 8 mm. As such, it is favorable for the cluster-shaped barrier structure to effectively package the edge of the display panel. In the case that the lengths of the first barrier strip and the second barrier strip are too short, it is difficult to achieve the packaging effect, resulting in poor water/oxygen-proof performance; in the case that the lengths of the first barrier strip and the second barrier strip are too long, it is undesirable to form a narrow border, leading to poor user experience.

According to some embodiments of the present disclosure, a top thickness h of the barrier strip ranges from 0.1 to 0.3 microns, for example, 0.1 microns, 0.2 microns, and 0.3 microns. As such, it is favorable for improving the edge packaging effect of the display panel. According to some specific embodiments of the present disclosure, a top thickness h of the first barrier strip 211 and the second barrier strip 221 ranges from 0.1 to 0.3 microns. As such, it is favorable for improving the edge packaging effect of the display panel. According to some embodiments of the present disclosure, referring to panel (a) of FIG. 10 or FIG. 11, the top thickness of the I-shaped structure ranges from 0.1 to 0.3 microns, for example, 0.1 microns, 0.2 microns, and 0.3 microns. According to some other embodiments of the present disclosure, referring to panel (b) of FIG. 10, the top thickness of the T-shaped structure ranges from 0.1 microns, 0.2 microns, or 0.3 microns.

According to some embodiments of the present disclosure, referring to FIG. 10, the thickness of the barrier strip arranges from 0.4 to 1.3 microns, for example, 0.4 microns, 0.5 microns, 0.7 microns, 0.9 microns, 1.2 microns, and 1.3 microns. As such, the barrier strip has a proper thickness, with no remarkable increase in the manufacturing cost but a good edge packaging effect of the display panel. A greater thickness of the barrier strip will lead to obviously increased manufacturing cost of the display panel, while a smaller thickness of the barrier strip will increase the difficulties in manufacturing the display panel and formation of the I-shaped or T-shaped barrier strips, which is undesirable for the edge packaging of the display panel. According to some specific embodiments of the present disclosure, both the first barrier strip and the second barrier strip have a thickness of 0.4 to 1.3 microns, for example, 0.4 microns, 0.5 microns, 0.7 microns, 0.9 microns, 1.2 microns, and 1.3 microns.

According to some embodiments of the present disclosure, the barrier strip is made of at least one of titanium, aluminum, or titanium-aluminum alloy. According to some specific embodiments of the present disclosure, the first barrier strip and the second barrier strip are both made of at least one of titanium, aluminum, or a titanium-aluminum alloy. According to the specific embodiments of the present disclosure, referring to panel (a) of FIG. 10 or FIG. 11, the material of the top and the bottom of the I-shaped structure is titanium, and the material of the middle connecting part is aluminum. As such, the barrier strip can form effective packaging at the edge of the display region upon forming the cluster-shaped barrier structure. According to some other specific embodiments of the present disclosure, the I-shaped structure or the T-shaped structure is formed by wet etching. As such, the structure is formed by a mature process, which is favorable for reducing the cost.

Figure 12:
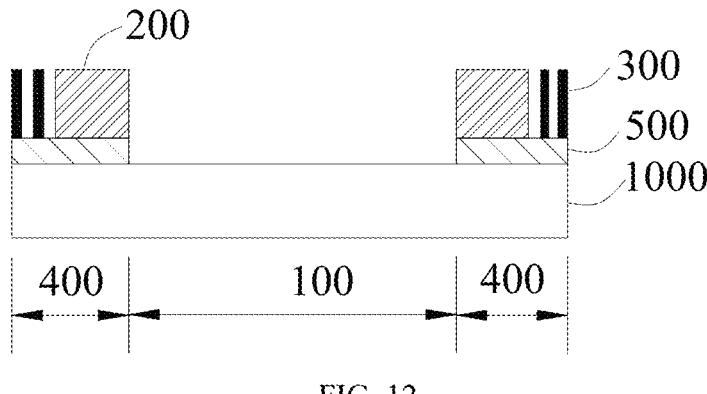
FIG. 12 shows a cross-sectional view of still another display panel according to some embodiments of the present disclosure.

According to some other embodiments of the present disclosure, referring to FIG. 12 (the components of the display region are not shown in FIG. 12), the display panel further includes an inorganic layer 500 disposed between the substrate 1000 and the cluster-shaped barrier structure 200, or disposed on the surface, proximal to the substrate 1000, of the cluster-shaped barrier structure 200. As such, the arrangement can achieve the effect of electrical insulation and further prevent moisture and oxygen from infiltrating into the internal part of the display panel, which is favorable for further improving edge packaging effect of the display panel. The specific material of the inorganic layer is not particularly limited, and can be reasonably selected by those skilled in the art according to actual requirements. According to some specific embodiments of the present disclosure, the material of the inorganic layer is silicon dioxide. As such, the inorganic layer can be formed by using materials with extensive sources, which is favorable for reducing the cost.

It should be noted that the inorganic layer 500 is formed synchronously with a planarization layer between the source and the drain electrode layer of a thin-film transistor and the anode of the light-emitting device. That is, the inorganic layer is in an integral structure with the planarization layer.

According to some embodiments of the present disclosure, referring to FIG. 6 or FIG. 8, the display panel further includes a plurality of strip-shaped barrier structures 300 spaced apart from each other and around a side, distal or proximal to the display region 100, of the cluster-shaped barrier structure 200 (only the case that the strip-shaped barrier structures are disposed around a side, distal to the display region, of the cluster-shaped barrier structure is shown in FIG. 6 or FIG. 8), and the strip-shaped barrier structure has a cross-section (i.e., the cross-section of the strip-shaped barrier structures along QQ' in FIG. 6) of an I-shaped structure or a T-shaped structure in the width direction (as shown in FIG. 10). As such, the strip-shaped barrier structures disposed on a side, distal or proximal to the display region, of the cluster-shaped barrier structure can further improve the edge packaging effect of the display panel. It should be noted herein that FIG. 6 only illustrates two strip-shaped barrier structures spaced apart from each other as an example, and the specific number of stripe-shaped barrier structures is also disposed by those skilled in the art according to actual requirements. It should be noted that FIG. 6 only illustrates a case where the display panel is round in shape, which does not limit the present disclosure.

According to some embodiments of the present disclosure, referring to FIG. 6, a length extending direction of the strip-shaped barrier structure 300 is substantially consistent with the extending direction (direction Y) of the edge line of the display region 100. As such, the arrangement of the strip-shaped barrier structure further improves the reliability of the edge packaging of the display panel. It should be noted herein that, due to limitations in manufacturing process, apparatus precision, and the like, it is difficult to ensure that the length extending direction of the strip-shaped barrier structure is completely consistent with the extending direction of the edge line of the display region.

According to some embodiments of the present disclosure, the top thickness of the strip-shaped barrier structure ranges from 0.1 to 0.3 microns. As such, it is favorable for improving the edge packaging effect of the display panel. According to some embodiments of the present disclosure, referring to panel (a) of FIG. 10 or FIG. 11, the top thickness of the I-shaped structure ranges from 0.1 to 0.3 microns, for example, 0.1 microns, 0.2 microns, and 0.3 microns. According to some other embodiments of the present disclosure, referring to panel (b) of FIG. 10, the top thickness of the T-shaped structure ranges from 0.1 microns, 0.2 microns, and 0.3 microns.

According to some embodiments of the present disclosure, referring to FIG. 10, a thickness H of the strip-shaped barrier structure ranges from 0.4 to 1.3 microns, for example, 0.4 microns, 0.5 microns, 0.7 microns, 0.9 microns, 1.2 microns, and 1.3 microns. As such, the strip-shaped barrier structure has a proper thickness, with no remarkable increase in the manufacturing cost but a good edge packaging effect of the display panel. A greater thickness of the strip-shaped barrier structure leads to obviously increased manufacturing cost of the display panel, while a smaller thickness of the strip-shaped barrier structure increases the difficulties in manufacturing the display panel and formation of the I-shaped or T-shaped structures, which is undesirable for the edge packaging of the display panel.

The specific structures of the substrate and the display region in the present disclosure are not particularly limited, and can be disposed by those skilled in the art according to actual requirements. According to some embodiments of the present disclosure, the substrate in the present disclosure further includes a thin-film transistor structure, and the like, and the display panel further includes an anode, a hole injection layer, a hole transport layer, a light-emitting layer, an electron transport layer, an electron injection layer, a cathode, and the like disposed in the display region of the substrate to form an OLED device.

In summary, the display panel provided in this disclosure disposes the cluster-shaped barrier structure at the edge packaging region of the display region to ensure that the ink droplets falling in the packaging region when printing light-emitting material do not fall into the gap between two adjacent barrier strips, but directionally migrate to the closed end, such that the edge packaging region is kept clean, the ink cannot form a continuous organic film layer in the edge packaging region, and filtration of moisture and oxygen into the display region is effectively prevented, thereby improving the packaging effect.

In another aspect of the present disclosure, the present disclosure provides a display device. The display device includes the display panel described above. As such, the display device has all the features and advantages of the display panel described above, which are not detailed herein. In summary, the display device has the advantages of good packaging performance, excellent reliability, improved user experience, and prolonged service life.

According to some embodiments of the present disclosure, the specific type of the display device is not particularly limited, and can be determined by those skilled in the art according to actual requirements. For example, the display device is a mobile phone, an iPad, a notebook, or the like.

Those skilled in the art will appreciate that the display device described above has the necessary structures and components of a conventional display device in addition to the display panel described above. Taking a mobile phone as an example, the display device further includes necessary structures and components such as a mainboard, a touch panel, a middle frame, a rear cover, a camera module, an audio module, and the like, in addition to the display panel described above.

In the description of the specification, the description referring to the terms "embodiment", "an embodiment", "another embodiment", "some embodiments", "some specific embodiments", and "some other specific embodiments", and the like means that specific features, structures, materials, or characteristics described in the embodiments are included in at least one embodiment of the present disclosure. In the specification, the schematic representations of the above terms are not necessarily intended to refer to the same embodiment or example. In addition, the specific features, structures, materials, or characteristics described are combined in a suitable manner in any one or more embodiments or examples. Moreover, various embodiments or examples and features of various embodiments or examples described in the specification can be combined by those skilled in the art in the case that they do not contradict each other. In addition, it should be noted that the terms "first" and "second" in the specification are merely used for descriptive purposes and should not be construed as indicating or implying the relative importance or as implicitly indicating the number of indicated technical features.

While embodiments of the present disclosure have been shown and described above, it is to be understood that the above embodiments are exemplary and should not be construed as limiting the present disclosure and that changes, modifications, substitutions, and variations in the above embodiments are made by those of ordinary skill in the art within the scope of the present disclosure.

What is claimed is:
1. A display panel, comprising:
a substrate comprising a display region and a packaging region surrounding the display region; and
a cluster-shaped barrier structure surrounding the display region and disposed on a surface of the packaging region, wherein the cluster-shaped barrier structure comprises a plurality of barrier strips, and a length extending direction of each barrier strip is intersected with an extending direction of an edge line of the display region:

wherein the cluster-shaped barrier structure comprises a plurality of first sub-cluster barrier structures and a plurality of second sub-cluster barrier structures disposed alternately, wherein each of the first sub-cluster barrier structures comprises a plurality of first barrier strips, a length of the plurality of first barrier strips extends in a direction away from the display region, and the plurality of first barrier strips are disposed in sequential contact at one end to form a first closed end of the first sub-cluster barrier structures, and are spaced apart from each other at another end to form a first open end of the first sub-cluster barrier structures;

each of the second sub-cluster barrier structures comprises a plurality of second barrier strips, a length of the plurality of second barrier strips extends in the direction away from the display region, and the plurality of second barrier strips are disposed in sequential contact at one end to form a second closed end of the second sub-cluster barrier structures, and are spaced apart from each other at another end to form a second open end of the second sub-cluster barrier structures; and in a circumferential direction of the display region, the first closed end and the second open end are disposed adjacently, and the first open end and the second closed end are disposed adjacently.

2. The display panel according to claim 1, wherein the plurality of barrier strips are sequentially disposed around the display region, ends, distal or proximal to the display region, of the barrier strips are connected to form continuous closed ends, while other ends of the barrier strips form open ends.

3. The display panel according to claim 1, wherein the barrier strip has a cross-section of at least one of an I-shaped structure or a T-shaped structure in a width direction.

4. The display panel according to claim 1, wherein the first closed end and the second open end disposed adjacently are disposed substantially flush, and the first open end and the second closed end disposed adjacently are disposed substantially flush.

5. The display panel according to claim 4, further comprising:

a first protrusion disposed on a side, distal to the first open end, of the first closed end, wherein the first protrusion is integrated with the first sub-cluster barrier structure; and a second protrusion disposed on a side, distal to the second open end, of the second closed end, wherein the second protrusion is integrated with the second sub-cluster barrier structure.

6. The display panel according to claim 1, wherein each barrier strip has a tangent line at a contact with the edge line of the display region, and an included angle between the tangent line and the barrier strip ranges from 70 to 90 degrees.

7. The display panel according to claim 1, wherein a top width of each barrier strip is d microns and an included angle between two adjacent barrier stripes is $\varphi$ degrees, wherein $\varphi < 0.12d+0.3$.

8. The display panel according to claim 7, wherein the top width of the barrier strip ranges from 5 to 20 microns.

9. The display panel according to claim 7, wherein $\varphi$ ranges from 0.1 to 2.

10. The display panel according to claim 1, wherein each of the first sub-cluster barrier structures comprises 5 to 50 first barrier strips and each of the second sub-cluster barrier structures comprises 5 to 50 second barrier strips.

11. The display panel according to claim 1, wherein a length of the barrier strip ranges from 1 to 8 mm.

12. The display panel according to claim 1, wherein a top thickness of the barrier strip ranges from 0.1 to 0.3 microns.

13. The display panel according to claim 1, wherein a thickness of the barrier strip ranges from 0.4 to 1.3 microns.

14. The display panel according to claim 1, wherein the barrier strip is made of at least one of titanium, aluminum, or a titanium-aluminum alloy.

15. The display panel according to claim 1, further comprising an inorganic layer disposed between the substrate and the cluster-shaped barrier structure.

16. The display panel according to claim 1, further comprising a plurality of strip-shaped barrier structures spaced apart from each other, wherein the strip-shaped barrier structures are disposed around a side, distal or proximal to the display region, of the cluster-shaped barrier structure, and the strip-shaped barrier structure has a cross-section of an I-shaped structure or a T-shaped structure in a width direction.

17. The display panel according to claim 16, wherein a length extending direction of each strip-shaped barrier structure is substantially consistent with the extending direction of the edge line of the display region.

18. A display device, comprising a display panel, wherein the display panel comprises:

a substrate comprising a display region and a packaging region surrounding the display region; and a cluster-shaped barrier structure surrounding the display region and disposed on a surface of the packaging region, wherein the cluster-shaped barrier structure comprises a plurality of barrier strips, and a length extending direction of each barrier strip is intersected with an extending direction of an edge line of the display region;

wherein the cluster-shaped barrier structure comprises a plurality of first sub-cluster barrier structures and a plurality of second sub-cluster barrier structures disposed alternately, wherein each of the first sub-cluster barrier structures comprises a plurality of first barrier strips, a length of the plurality of first barrier strips extends in a direction away from the display region, and the plurality of first barrier strips are disposed in sequential contact at one end to form a first closed end of the first sub-cluster barrier structures, and are spaced apart from each other at another end to form a first open end of the first sub-cluster barrier structures;

each of the second sub-cluster barrier structures comprises a plurality of second barrier strips, a length of the plurality of second barrier strips extends in the direction away from the display region, and the plurality of second barrier strips are disposed in sequential contact at one end to form a second closed end of the second sub-cluster barrier structures, and are spaced apart from each other at another end to form a second open end of the second sub-cluster barrier structures; and in a circumferential direction of the display region, the first closed end and the second open end are disposed adjacently, and the first open end and the second closed end are disposed adjacently.

19. The display device according to claim 18, wherein the plurality of barrier strips are sequentially disposed around the display region, ends, distal or proximal to the display region, of the barrier strips are connected to form continuous closed ends, while other ends of the barrier strips form open ends.

* * * * *